United States Patent [19]
Ko

[11] Patent Number: 4,977,402
[45] Date of Patent: Dec. 11, 1990

[54] NONHYSTERETIC PERIODIC-THRESHOLD SQUID COMPARATOR AND A/D CONVERTER

[75] Inventor: Herbert Ko, Mountain View, Calif.

[73] Assignee: Hewlett-Packard Company, Palo Alto, Calif.

[21] Appl. No.: 261,813

[22] Filed: Oct. 24, 1988

[51] Int. Cl.⁵ .................. H03M 1/00; G01R 33/035
[52] U.S. Cl. .................................. 341/133; 505/846
[58] Field of Search .............. 505/846; 324/248; 341/133

[56] References Cited

U.S. PATENT DOCUMENTS 4,491,795  1/1985  Gelinas ........................... 724/248
4,672,359  6/1987  Silver ............................. 341/133

OTHER PUBLICATIONS

W. H. Chang IBM Technical Disclosure Bulletin, "Interferometric Measurement of Magnetic Flux", vol. 25, No. 6, Nov. 1982.

Primary Examiner—William M. Shoop, Jr.
Assistant Examiner—Helen Kim

[57] ABSTRACT

A SQUID comparator having two junctions configured so that its operating characteristics are substantially the same as a single junction SQUID. In particular, the ratio of the critical current of these two junctions is selected to avoid introduction of hysteresis. An n-bit single pass comparator is present that can produce 4-bit A/D conversion up to 10 GHz. A method is implemented to remove effects of dynamic hysteresis by use complementary comparators.

15 Claims, 11 Drawing Sheets

FIG 11

NONHYSTERETIC PERIODIC-THRESHOLD SQUID COMPARATOR AND A/D CONVERTER

In the figures, each element will be represented by a reference numeral having a first digit that indicates the first figure in which that element is presented.

FIELD OF THE INVENTION

This invention relates in general to comparators and relates more particularly to periodic threshold SQUID comparators that have advantageous utility in high speed single pass A/D converters.

BACKGROUND OF THE INVENTION

Over the last few years there has been a great deal of work on single pass Josephson junction Analog to Digital (A/D) converters using two- and three-junction Superconducting QUantum Interference Devices (SQUIDs) (see, for example, C. A. Hamilton et al., "Superconducting A/D Converter Using Latching Comparators", IEEE Tran. Magn., vol MAG-21, pp. 197–199, Mar. 1985 and Spargo et al, "Analog Signal Processing With Josephson Junctions: Analog to Digital Conversion", Extended Abstracts of the 1987 International Superconductivity Electronics Conference, Aug. 28, 1987, Tokyo, pp. 319–334). Single pass A/D converters are attractive because of their increased speed of analog-to-digital conversion compared to multiple pass converters such as successive approximation and parallel feed-forward converters. These single pass A/D converters typically use two- and three-junction converters of the type illustrated in these two references.

Figure 1:
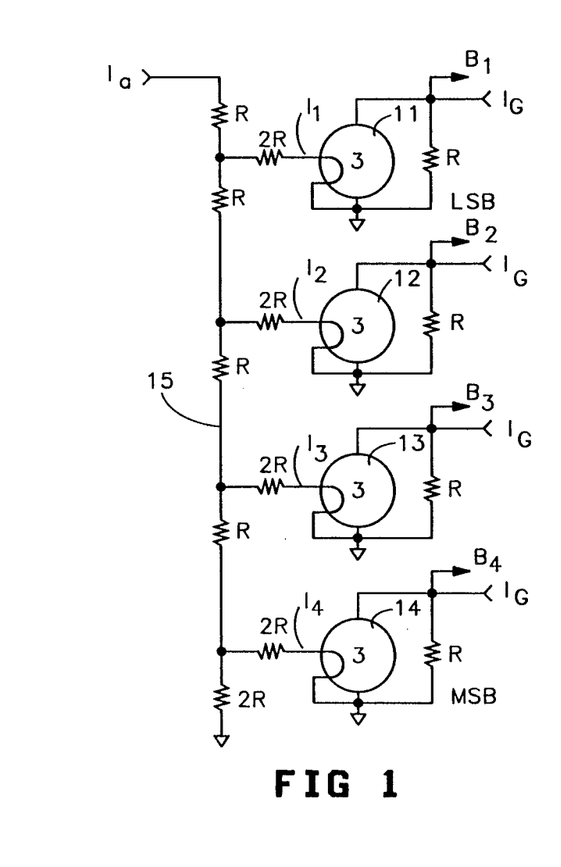
FIG. 1 illustrates an existing single pass 4-bit A/D converter utilizing n periodic threshold comparators in a resistance bridge.

As taught in Spargo, contrary to conventional A/D converters which require $2^n - 1$ comparators to distinguish the $2^n$ levels characteristic of an n-bit A/D converter, an A/D converter utilizing periodic threshold comparators can distinguish these $2^n$ levels with n periodic threshold comparators. Such a comparator is illustrated in FIG. 1.

Figure 2:
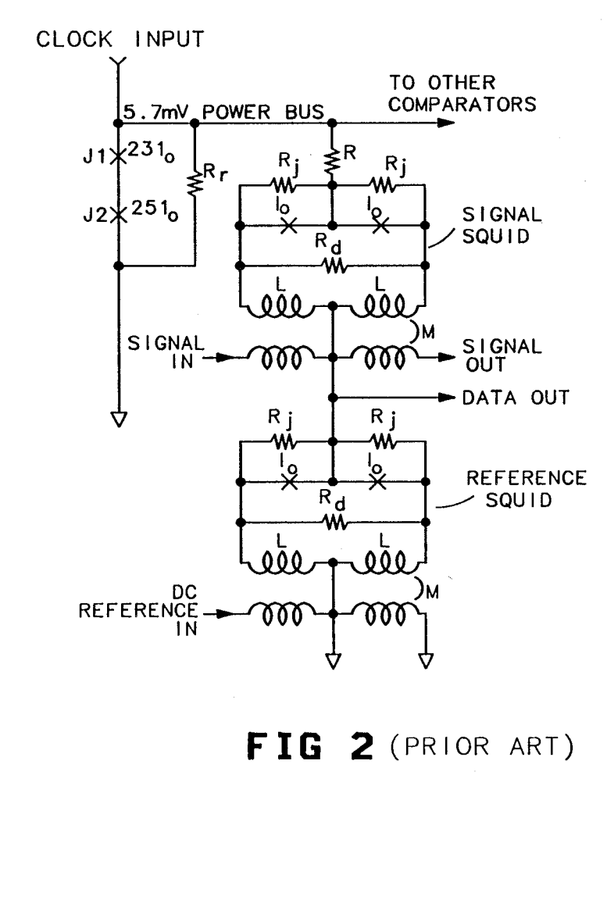
FIG. 2 is a block diagram of each of the two-junction SQUID comparators utilized in the A/D converter of FIG. 1.

Unfortunately, as taught by Hamilton et al, these A/D converters exhibit a 100 MHz bandwidth that is far less than the 5 gigasamples/second potential conversion rate of the converters. The reasons for this are as follows. In a single pass converter, a gate signal is used to capture the value of the test signal during the gate pulse. In order to divide the range of the test signal into $2^n$ levels, the gate pulse must be narrow enough that the signal under test does not vary by more than $I_{max}/2^n$ during the gate pulse. This limits the frequency response of the A/D converter to less than $\frac{1}{2}{}^n\pi\tau$ where $\tau$ is the width of the gate pulse. Hamilton shows that, in an 8-bit A/D converter utilizing prior art two- and three-junction SQUIDs (such as the two-junction SQUID of FIG. 2), when the frequency of the signal under test is above 100 MHz, the gate signal produces hysteretic transient responses 31 and 32 (shown in FIG. 3) that cause spurious A/D conversion. These transients occur at those values of the test signal $I_a$ at which the quantized magnetic flux through the SQUID changes abruptly between successive discrete values. These transient responses interfere with the less significant bits of the A/D converter and introduce hysteretic effects that make the measured value dependent on whether the signal is increasing or decreasing. Thus, to achieve the potential conversion speed of A/D converters utilizing SQUIDs, a new design of the SQUID comparator is needed.

SUMMARY OF THE INVENTION

In accordance with the illustrated preferred embodiment, a SQUID comparator is presented that can be used in A/D converters that operate above 100 MHz. It was observed that prior art devices utilize two- and three-junction SQUIDs that exhibit transients that limit operation to less than 100 MHz. On the other hand, one-junction SQUIDs (illustrated in FIGS. 4A and 4B) exhibit transients small enough to be within the error tolerance of a 4-bit A/D converter sampling a 10 GHz signal. Thus, it would be advantageous to design an A/D converter that utilizes SQUIDs having a single Josephson junction. However, to introduce the gate current to control the sampling interval and to enable the value of the test signal to be captured in response to the gate pulse, it was necessary to introduce a second Josephson junction into the SQUID. However, the critical current of this second junction is selected so that the pair of junctions exhibit substantially the same transient and hysteretic responses as a single junction. N of these comparators are utilized in a current dividing network to produce an n-bit single pass A/D converter that can operate on signals up to 10 GHz. In another embodiment, $2n+1$ of these comparators are utilized in a current dividing network with some associated logic that enables elimination of dynamic hysteretic effects.

DESCRIPTION OF THE PREFERRED EMBODIMENT

Figure 4A:
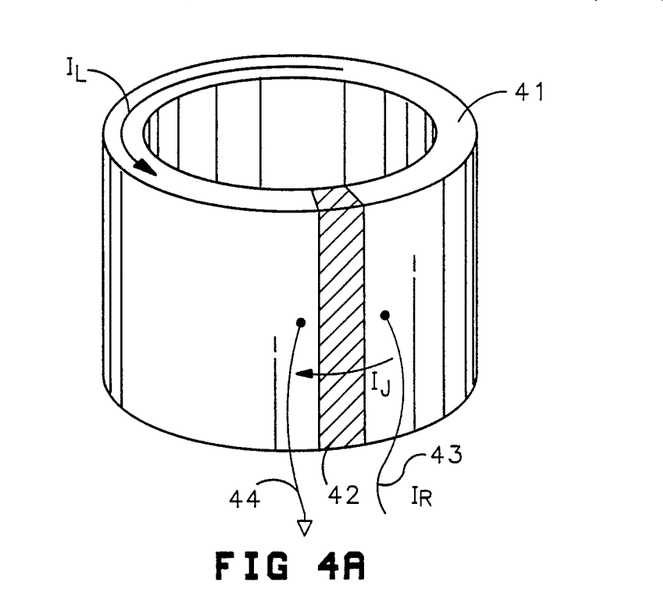
FIG. 4A is a discrete component version of a SQUID having a single Josephson junction.
Figure 4B:
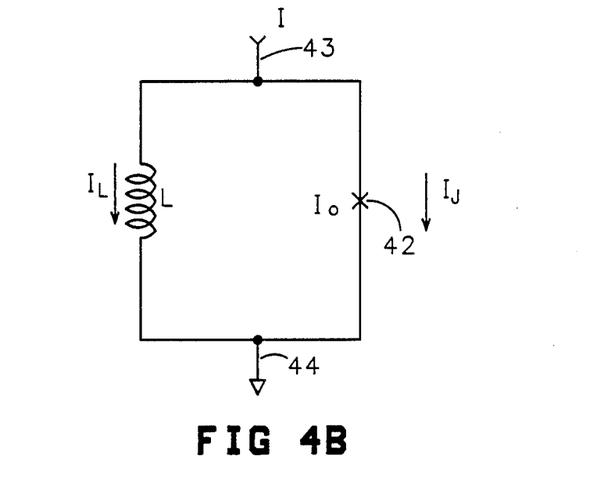
FIG. 4B is an electrical schematic diagram of a one junction SQUID.

In FIG. 4A is shown an electrical schematic diagram of a SQUID 41 having a single Josephson junction 42. When an input current $I_k$ is injected at an input 43, this current divides into a junction current $I_J$ that passes to ground 44 through Josephson junction 42 and into a current $I_L$ that travels to ground 44 without passing though junction 42. Current $I_L$ experiences an inductance L in passing in this direction around the SQUID from input 43 to ground 44. When the temperature of SQUID 41 is below the critical temperature $T_c$ of the superconducting material forming SQUID 41, the SQUID is superconducting. This junction is characterized by a critical current $I_O$ that is the largest current it can conduct without converting to a resistive state.

Figure 5A:
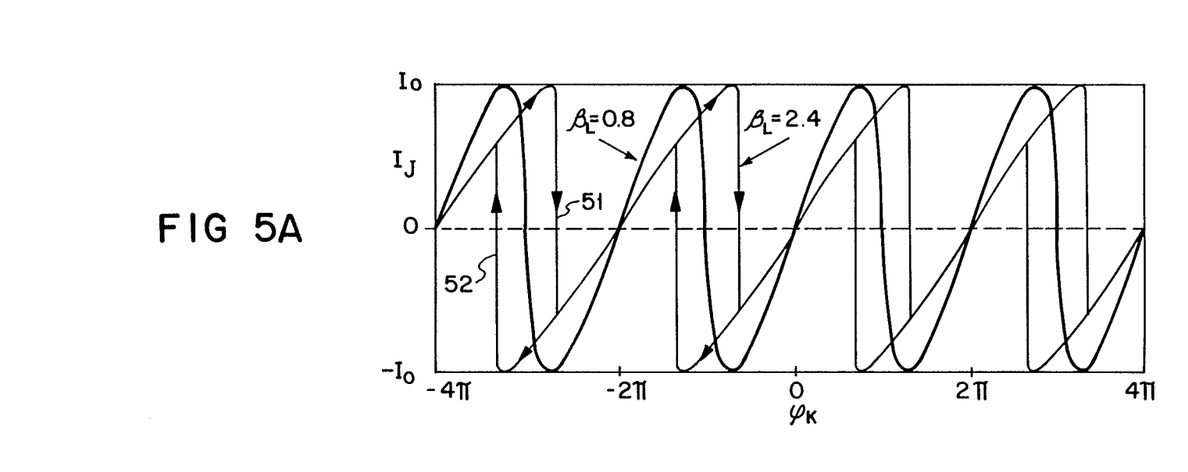
FIG. 5A is a plot of junction current $I_J$ as a function of $\phi_a/\Phi_O$, where $\phi_a = 2\pi L I_a/\Phi_O$ and $\Phi_O$ is the fundamental constant $h/2e$ (where h is Planck's constant and e is the fundamental unit of charge).
Figure 5B:
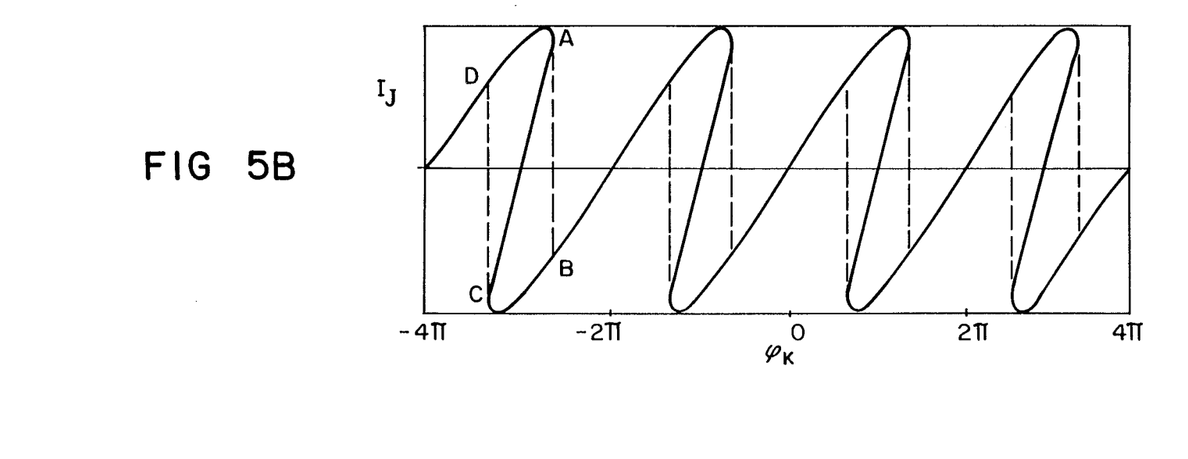
FIG. 5B illustrates the source of hysteresis in FIG. 5A for $\beta_L > 1$.

In a single junction SQUID, the input current $I_k$ and the junction current $I_J$ obey the relationship:

$$\phi_k = \phi_J + \beta_L \sin \phi_J \quad (1)$$

where $\phi_J \equiv \sin^{-1}(I_J/I_O)$ is the phase difference of the superconducting state across the junction, $\phi_k \equiv 2\pi L I_k/\Phi_O$, $\Phi_O$ is the fundamental constant h/2e (where h is Planck's constant and e is the fundamental unit of charge) and $\beta_L \equiv 2\pi L I_O/\Phi_O$. These curves are presented in FIG. 5 for a value of $\beta_L$ less than one and for a value greater than one. For $\beta_L$ greater than one, this curve becomes hysteretic- that is, for increasing $I_k$, branch 51 of the curve is taken for increasing $I_k$, but branch 52 is taken for decreasing $I_k$. Such hysteresis occurs even at low signal frequencies, so this hysteresis will be referred to herein as "low frequency hysteresis". The cause of this is illustrated in FIG. 5B. For $\beta_L > 1$, equation (1) shows that $I_J$ is not a single valued function of $\phi_k$ so that there are two stable states for a some values of $\phi_k$, thereby producing hysteresis. At point A, this state is unstable and jumps across to point B. Similarly, at point C, this state is again unstable and jumps across to point D. Thus, the single junction SQUID can be nonhysteretic only if $\beta_L$ is equal to or less than one.

Figure 3:
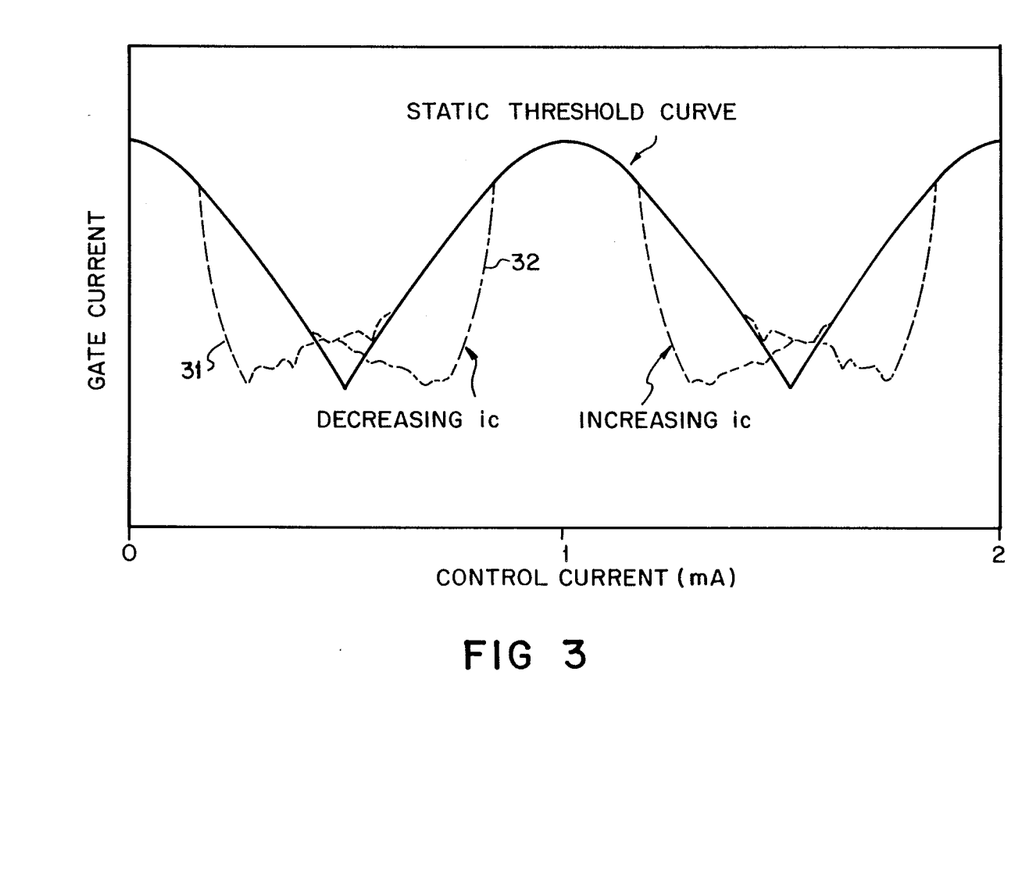
FIG. 3 illustrates the transient response of the two- and three-junction SQUIDs that limits the bandwidth in A/D converters using such SQUIDs.

This single junction SQUID does not exhibit the transient responses 31 and 32, shown in FIG. 3, that is characteristic of existing two- and three-junction SQUIDs presently used in single pass A/D converters (also called flash type A/D converters). As a result of this, such single junction SQUID converters have the potential to enable these single pass converters to achieve a bandwidth much greater than the 100 MHz bandwidth now exhibited by these single pass A/D converters.

Unfortunately, this single-junction SQUID will not, by itself, function as a comparator. When $I_J$ exceeds $I_O$, the Josephson junction becomes resistive. However, because there is still a superconducting path to ground 44 through inductance L, input current $I_k$ quickly redirects entirely through L without producing a voltage for a sufficient interval to capture the value of this voltage. This prevents the single junction SQUID, by itself, from functioning as a comparator.

Figure 6A:
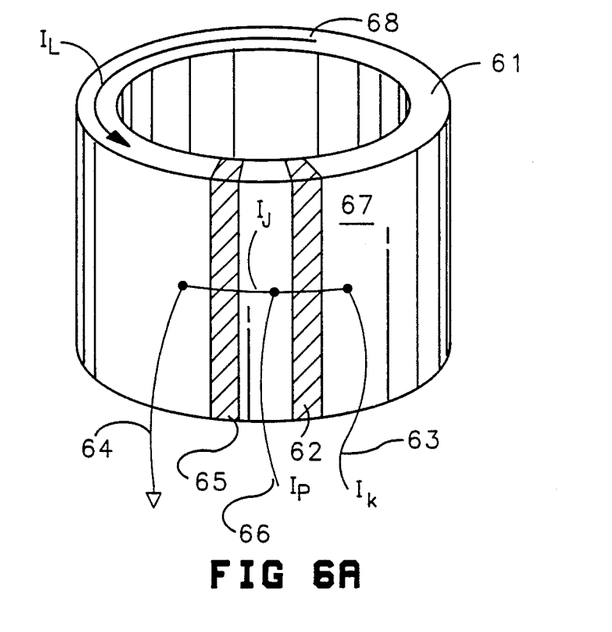
FIG. 6A illustrates a SQUID having its ground more closely spaced from the test signal input via the path through the two Josephson junctions than via the other path between them around the SQUID.

This drawback is overcome by the introduction of a second junction 65 in the path of current $I_J$. This two junction SQUID 61 is illustrated in FIG. 6A. Unlike the prior art Josephson junction comparators, both of these junctions 62 and 65 are in the same current path from input 63 to output 64 to ground. A clocked bias input 66 is provided between junctions 62 and 65 to enable application of a clocked bias current and sampling pulse to controllably switch junctions 62 and 65 between superconducting and resistive states. When these junctions are in their resistive states, on clocked bias input 66 a voltage is produced that is representative of the signal $I_k$ at the time of the pulse on clocked bias input 66. This transition will be discussed in greater detail below. This trapped voltage can be measured and stored by well known means for storing this digitized value of the input current $I_k$.

Because the single junction SQUID does not exhibit the transient response of the two- and three-junction SQUIDs shown in FIG. 3, it is advantageous to make the two-junction SQUID of FIG. 6 exhibit substantially the same variation of $I_J$ with $I_k$ as is exhibited by the one-junction SQUID of FIG. 4A. The critical current $I_S$ of the second Josephson junction 65 is selected to be large compared to the critical current $I_O$ of junction 62. For $I_S >> I_O$, the relationship between $I_k$ and $I_J$ can be approximated to first order in $I_O/I_S$ by $$\phi'_k = \phi_J + \beta'_L \sin \phi_J \quad (2)$$

where $\phi_J$ still equals $\sin^{-1}(I_J/I_O)$, the phase difference of the superconducting state across junction 62, $\phi'_k \equiv \phi_k - \sin^{-1}(I_r/I_S)$, $\beta'_L \equiv 2\pi L I_O/\Phi_O + I_O/\{I_S*[1-(I_r/I_S)]^{\frac{1}{2}}\}$ and $I_r$ is a clocked bias current supplied to clocked bias input 66. This quasi-single-junction SQUID can be nonhysteretic only if $\beta'_L$ is equal to or less than 1. This is preferably achieved by selecting $I_S/I_O$ much greater than 1 and selecting the inductance L to be small (on the order of or less than 6 picoHenrys). Typically, $I_S/I_O$ will be selected to be greater than 3 and, preferably, will be selected to be on the order of 10. However, $\beta_L$ can be made less than 1 for $I_S/I_O$ slightly greater than 1 if L is small enough. It is also advantageous for junctions 62 and 65 to be coupled by a minimal amount of inductance as represented schematically by an inductor 101 between the first Josephson junction 62 and the input 66 and by another inductor 102 between the input 66 and the second Josephson junction 65, and therefore the junctions 62 and 65 should be as close to one another spatially as the circuit processing allows.

Figure 6B:
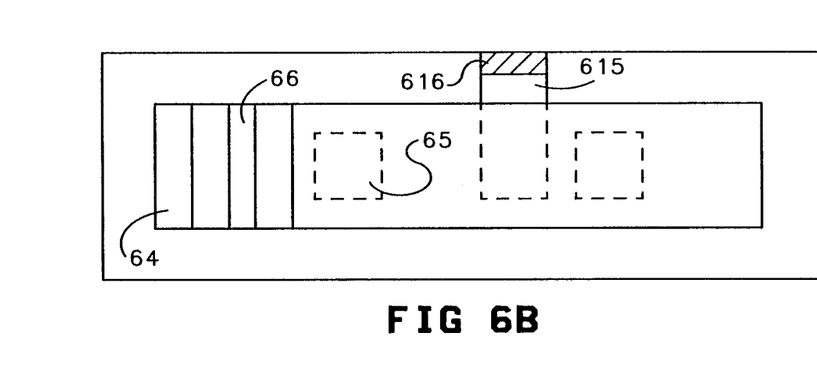
FIGS. 6B and 6C are top and side views, respectively, of an integrated circuit version of the embodiment of the comparator of FIG. 6A.
Figure 6C:
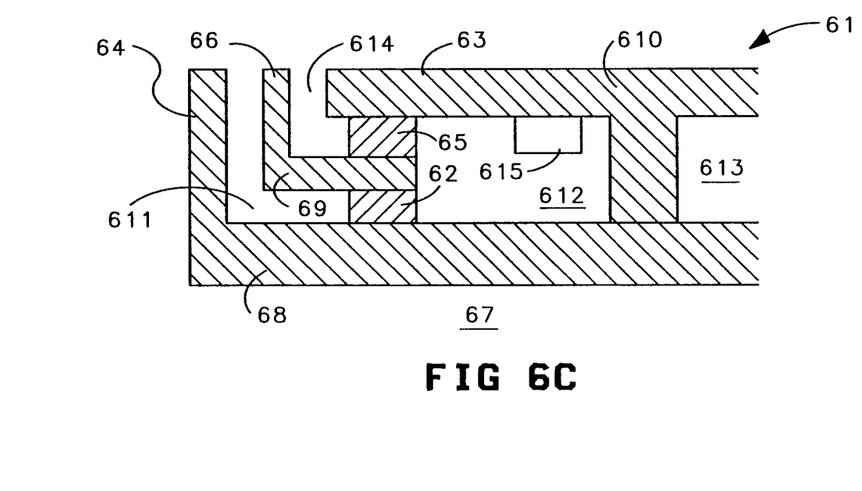

The structure and formation of Josephson junctions and SQUIDs are well known. In present circuits, it is more likely that integrated circuit embodiments of SQUIDs will be utilized than that discrete component SQUIDs, as in FIG. 6A, will be utilized. FIGS. 6B and 6C are top and side views of an integrated circuit embodiment of the SQUID of FIG. 6A. On a substrate 67 are formed, by well known integrated circuit processing techniques, superconducting regions 68, 69, and 610 and insulating regions 611-614. Josephson junction must be very thin (on the order of 1 nanometer), so junctions 62 and 65 can be produced by alteration of a portion of the surfaces of superconductors 68 and 69. For example, if the superconductors 68-610 are Niobium, then these regions can be formed by oxidations of the portions of these surfaces indicated as the Josephson junction regions 62 and 65. Only a limited class of compounds are superconducting. The Josephson junction can be produced by varying the composition in the region of the junction such that material of that composition, in bulk, will not be superconducting at that temperature.

An alternate embodiment can be easily manufactured in which the input current $I_k$ is not directly injected at input 63, but instead is induced by magnetic coupling from a strip-line conductor adjacent to superconductor region 610. The magnetic field produced by the current in this stripline will couple into insulating region 612 thereby inducing a current around the ring of the SQUID. It is desirable to introduce a resistive element to damp out transitory responses of the SQUID. This resistor can be produced as a high resistance thin layer 615 (e.g., a layer of molybdenum) connecting superconductor 610 to ground 616.

Figure 7:
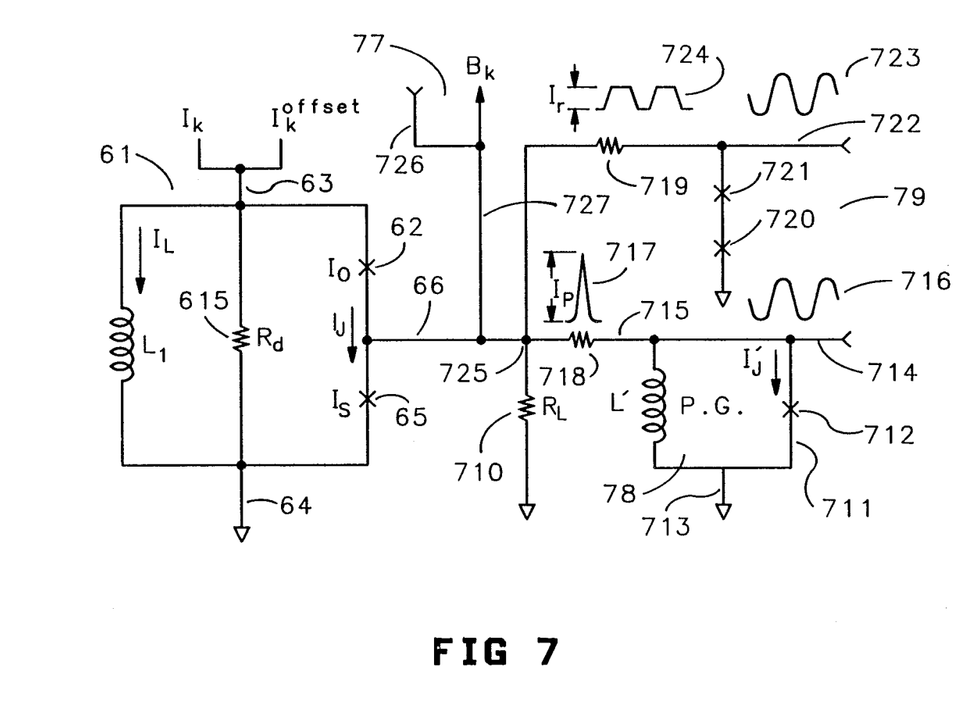
FIG. 7 is an electrical schematic diagram of a SQUID comparator utilizing a quasi-one-junction SQUID of the type illustrated in FIGS. 6A–6C.

FIG. 7 is an electrical schematic diagram of a comparator 77 utilizing a pseudo-single-junction SQUID 61 of the type shown in FIG. 6A. Inductance L is the inductance experienced in the current path that extends from input 63 to output 64 to ground and that does not pass through junction 62 or 65. In addition to SQUID 61, comparator 77 includes a pulse generator 78, a bias circuit 79 and an impedance $R_L$ (such as resistor 710) connecting clocked bias input 66 to ground.

Although other pulse generator structures can be used, in this embodiment the pulse generator 78 consists of a single-junction SQUID 711 having a Josephson junction 712, a ground 713, a clock input 714, an inductance L' and a pulse output 715 that is connected to the clocked bias input 66 of pseudo-single-junction SQUID 61. In response to a positive going cycle of a clock signal 716, a current $I'_J$ is produced through junction 712. The amplitude of the clock signal is selected so that the flux in SQUID 711 will pass through the mode boundary between zero and single quantum flux states of the SQUID. This generates a current pulse 717 of peak amplitude $I_p$.

At clocked bias input 66, current pulse 717 sees a superconducting short through junction 65 to ground. This pulse also sees a much higher impedance path through junction 62 to the parallel combination of inductance L and the output impedance of the circuit being sampled. Therefore, pulse 717 travels substantially only through junction 65. If this pulse, combined with a bias signal and the signal $I_J$ is large enough to produce through junction 65 a total current in excess of $I_s$, then this junction will abruptly change to a resistive state. This transition to resistive state redirects this pulse into the superconducting path through junction 62. Since $I_s$ is greater than $I_O$, this reflected pulse is large enough to make junction 62 switch into its resistive state. In their resistive states, junctions 62 and 65 have impedances on the order of 10 and 100 ohms, respectively, when $I_s/I_O$ is on the order of 10 and $I_O$ is on the order of 0.1 mA. Therefore, resistances 710, 718 and 719 are each selected to have an impedance on the order of 2 ohms. These choices lead to a sufficient redirection of the bias current through resistor 710 for other circuitry to record whether the voltage on sampling input 66 is in a high voltage state or a zero voltage state. This can be accomplished by reading the voltage $B_k$ on an output line 727 or, alternatively, can be accomplished by connecting additional circuitry in series with resistor 710 to measure the current through resistor 710. Thus, the binary value of the voltage on the sampling input 66 can be stored to produce a digital indication of the applied current $I_k$.

The operation and purpose of bias circuit 79 (consisting of resistance 719, Josephson junctions 720 and 721, and clock input 722 on which a clock signal 723 is applied) are as follows. A DC offset is added to clock signal 716 to produce a second clock signal 720 that has substantially zero or slightly negative current at its minima. Its peak amplitude is larger than the threshold value needed to set junctions 720 and 721 into their resistive states. When this threshold voltage is exceeded, junctions 720 and 721 become resistive and pin the voltage on input 722 at the sum of the gap voltages of junctions 720 and 721. This produces through resistor 719 a truncated clocked bias current 724 that varies between zero and a truncated peak value of $I_r$. An additional bias line 726 enables input of a trimming current to adjust for processing variations in $I_S$ and resistors 718 and 719.

These two clock signals are timed so that pulse 717 occurs during the truncated portion of signal 724. Preferably, it occurs near the middle of this truncated portion so that there will be minimal sensitivity to timing variations from one machine to another. The sum $I_r + I_p$ is substantially equal to $I_s$ so that, when pulse 717 is applied to junction 65, this junction will remain superconducting if $I_J$ is negative and will become resistive if $I_J$ is positive. Equivalently, the sum $I_s + I_p$ is selected such that, when $I_J$ is zero, junction 62 is biased by currents 717 and 724 to a point at which there is a 50% noise induced probability that it will make the transition into its resistive state. With this choice, if $I_J$ is positive at the time of pulse 717, then junctions 62 and 65 will become resistive, thereby producing on node 725 a voltage substantially equal to $I_r R_L$. If $I_J$ is negative when pulse 717 is applied to clocked bias input 66, then the voltage on node 725 will be zero.

Figure 8:
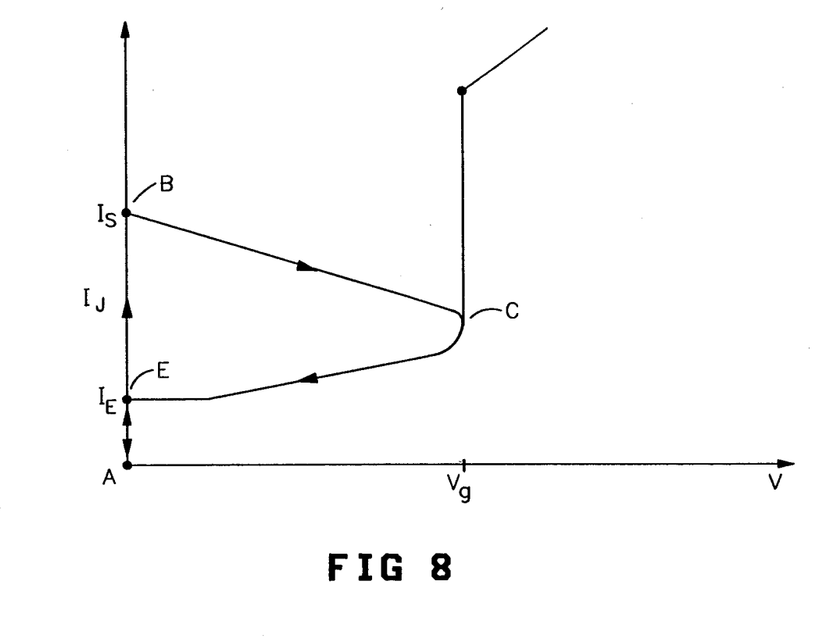
FIG. 8 illustrates the hysteretic current-voltage characteristics of a Josephson junction.

In each low current portion of clocked bias current 724, junctions 62 and 65 are reset to their superconducting states. The current voltage curve of junction 65 is shown in FIG. 8. If the initial current and voltage are zero (point A), then as the amount of current through this junction increases, the current-voltage state moves along the I axis from point A to point B at which the current equals the critical current $I_S$ of junction 62. At this point, junction 65 jumps to the resistive state at point C. The voltage on node 725 is measured during the truncated peak portions of clocked bias current 724 and will be a high voltage if $I_J$ was positive at the time of pulse 717 and will otherwise be zero. Because of this, the lower level binary state of signal 724 is selected to be less than $I_E$ which is on the order of 0.1 times the critical current $I_S$ for junctions 62 and 65. It should be noticed that pulse generator 78 also produces a negative pulse between each successive pair of positive pulses. The windows in which the voltage on node 725 are measured do not overlap these negative spikes.

Comparators of this type can be utilized in the A/D converter of FIG. 1 to produce A/D converters that have a small enough transitive response that 4-bit conversion can be achieved at up to 10 GHz input signal $I_a$. Such an A/D converter operates as follows. Comparators 11–14 (also referred to herein as the 1st, 2nd, 3rd and 4th comparators) are connected to a resistive ladder that injects the amount of current $I_k = I_a/2^k$ (for k=1, . . . , 4) to the kth comparator. These currents are converted to three-digit binary values in the manner illustrated in FIG. 9 for binary code conversion and illustrated in FIG. 10 for Grey code.

Figure 9:
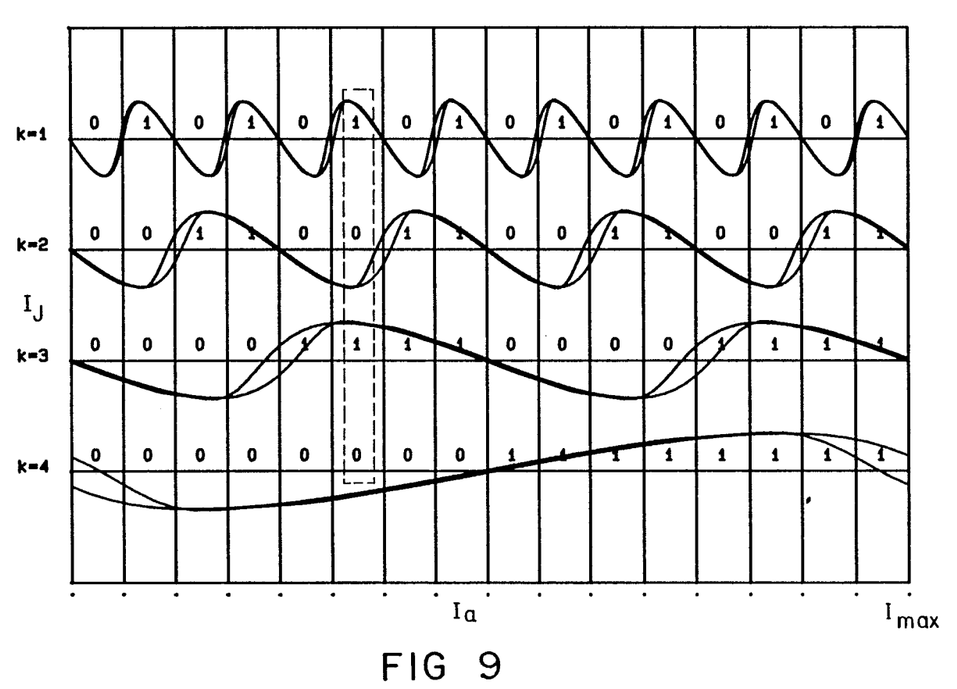
FIG. 9 illustrates the process of signal conversion for the case of a 4-bit A/D converter.

In FIG. 9, the junction current $I_J$ is plotted for each of comparators 11–13 as a function of the its input current. The junction current $I_J$ of the kth comparator will vary through $2^{k-1}$ periods as $I_a$ increases from 0 to a maximum current $I_{max}$ for the A/D converter. For four bits, there are 16 different digital values that can be assigned to the input current amplitude. If $I_k$ is between some integers m and (m+1) times $I_{max}/16$, then the binary value generated will be equal to m (base 2). The case of m=5 is indicated by dashed lines encircling the binary value for that case.

Figure 10:
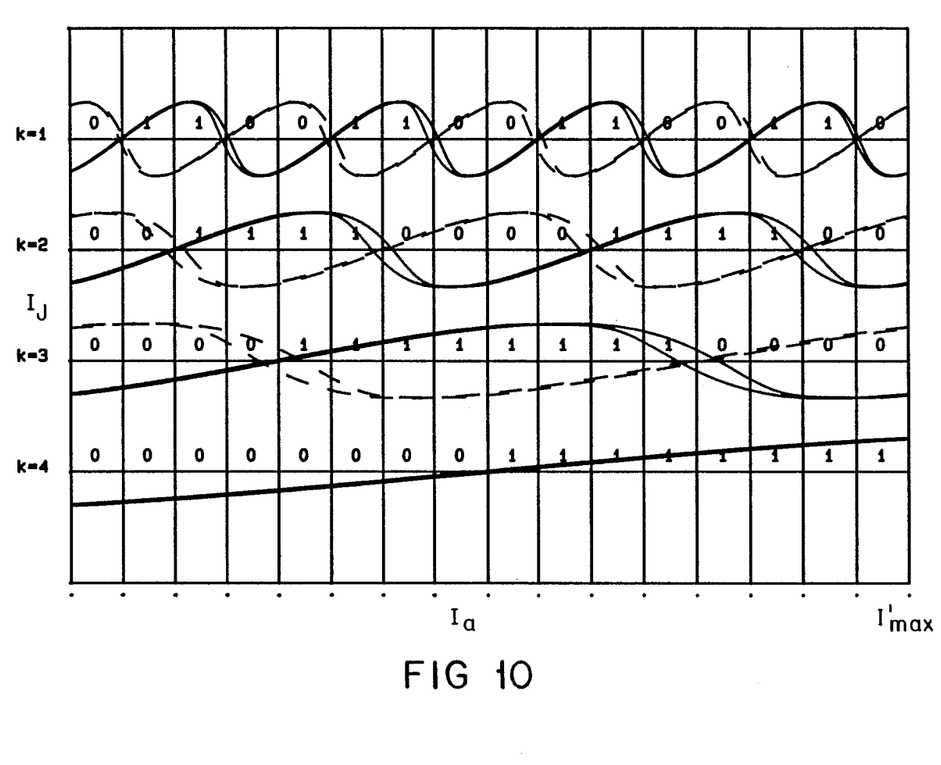
FIG. 10 illustrates the process of signal conversion for the case of a 4-bit A/D converter utilizing Grey code digital encoding.

In FIG. 10, the solid curves illustrate the operation of this A/D converter for the case of Grey code encoding. This Grey code case has two advantages over the binary coding example of FIG. 9. First, the junction current $I_J$ of the kth comparator will vary through $2^{n-k-1}$ periods as $I_a$ increases from 0 to a maximum current $I'_{max}$ for the A/D converter. Since, for each value of k, this is one-half the number of periods for the binary coding case of FIG. 9, $I'_{max}$ for the Grey code embodiment of FIG. 10 is half $I_{max}$ of the embodiment of FIG. 9. Therefore, the Grey code embodiment is twice as sensitive as the binary code embodiment. Second, in the Grey code case, no two binary signals make a 0-to-1 or 1-to-0 transition concurrently. As a result of this, a hysteretic error at any given 0-to-1 or 1-to-0 transition in one of the currents $I_k$ produce an error of only $I_{max}/2^n$ (for an n-bit A/D converter), regardless of which of these currents $I_k$ produces this error. In contrast, in the binary coding example of FIG. 9, such an error in the current $I_{k9}$ will produce an error $I_{max}/2^{n-k+1}$.

The Grey code curves of FIG. 10 exhibit, in comparison to the binary code curves of FIG. 9, a polarity inversion, a reduction of the maximum current by one-half and a relative phase shift. The relative shift of these curves along the $I_a$ axis relative to the curves in FIG. 9 can be easily achieved by the addition, to the input 63 of the kth comparator, of an offset current $I_k^{offset}$ as illustrated in FIG. 7. This offset current can alternatively be introduced by inductive coupling to the SQUID instead of by direct coupling as in FIG. 7. To achieve the shift exhibited in FIG. 10 compared to FIG. 9, the values of the offset currents are $I_k^{offset} = -\Phi_0/4L$.

The comparator of FIG. 7 has two sources of error at high frequency. The first is the aperture error due to the finite width of sampling pulse 717. If the test signal exceeds the critical current $I_S$ any time during this pulse, then junctions 65 and 62 will be switched into their resistive states and a binary value of 1 will be recorded on node 725. This sets the limit on the frequency response of the A/D converter at $f_a < \frac{1}{2}^n\pi\tau_a$ where $\tau_a$ is the minimum of the width of pulse 717 and the response time of node 725 and is in practice equal to the inductive limit $\Phi_o/I_oR_d$.

The other source of error is the slow response of the quasi-single-junction SQUID to rapidly changing inputs. The choice of $\beta_L < 1$ was made to avoid introducing $\beta_L$ related hysteresis into $I_J$. Even though the transfer function $I_J(I_k)$ is single valued at low frequency, the capacitance and inductance in SQUID 61 cause a dynamic hysteresis. This hysteresis is illustrated in FIG. 10.

This dynamic hysteresis occurs near the points where the comparator input $I_k$ induces an applied flux of $LI_k$, $=(2m-1)\Phi_o/2$, where m is an integer and $\Phi_o$ equals h/2e. The deviation is largest there because the rate of change in the self-induced flux in the SQUID is greatest there. This deviation decreases with decreasing $\beta_L$ as the result of an associated decrease in the LC time constant in the circuit and a decrease in $dI_s/dI_k$ near $\phi_k = (2m-1)\pi$ for some integer m.

Figure 11:
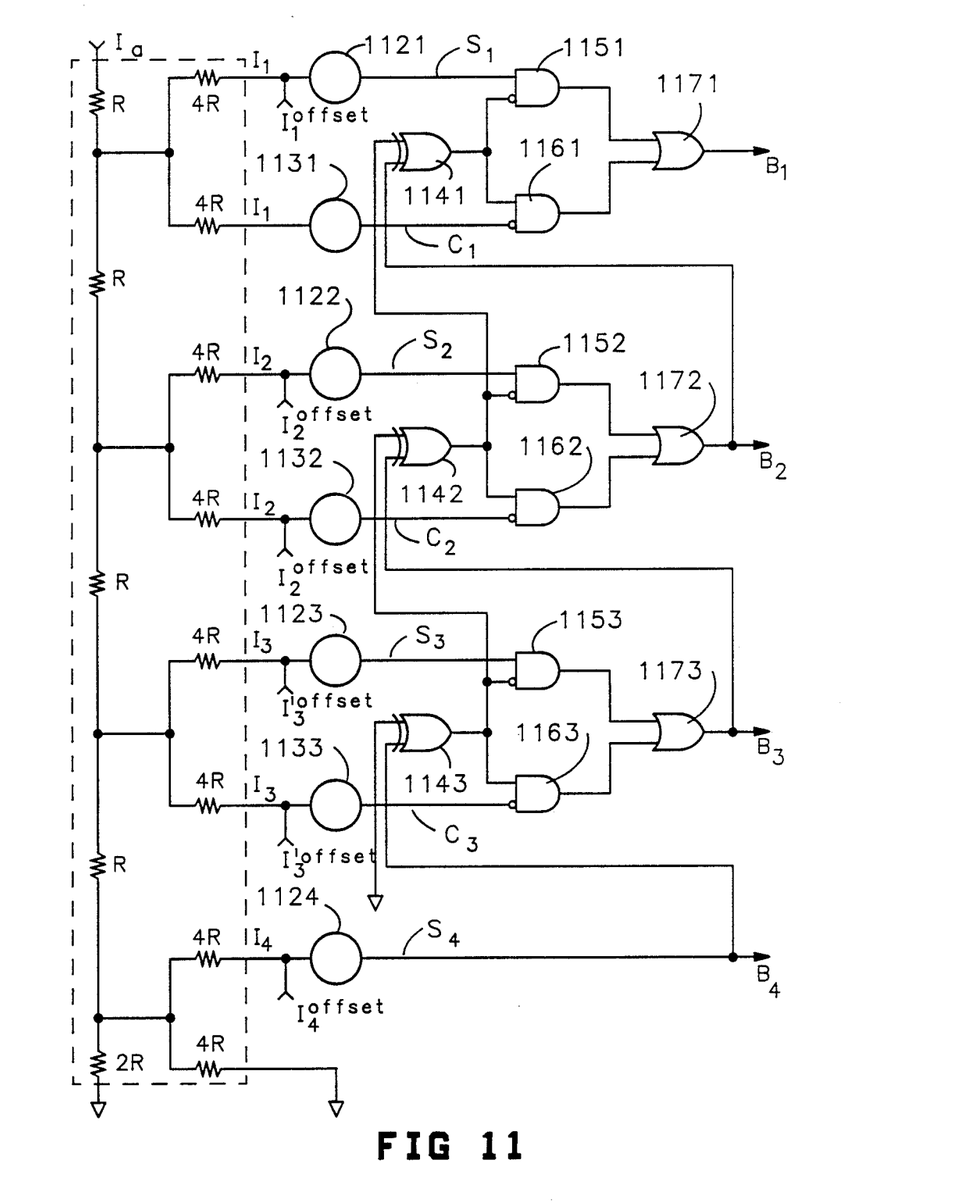
FIG. 11 illustrates an n-bit A/D converter utilizing 2n+1 comparators and associated logic to substantially reduce dynamic hysteretic effects of these comparators.

These dynamic hysteresis errors are eliminated in the embodiment of FIG. 11. For each bit other than the least significant bit, a pair of comparators respond to current $I_k$. The manner in which these errors are eliminated can be understand by reference to FIG. 10. There is no hysteresis in the portion of the comparator response curve for k=4 so no additional comparator is needed to remove hysteretic errors in this least significant bit. For each of the other values of k, an additional comparator is included. The plots of the junction current $I_J$ of each of these comparators as a function of $I_a$ are presented as the dashed curves in FIG. 10. For each of these comparators, the offset current $I'_k^{offset}$ includes an additional amount of current $-\Phi_0/2L$ so that each dashed curve is offset by one half cycle from its corresponding solid curve. This offset assures that the binary output from each of the comparators in such a pair are complementary. More importantly, this assures that, when one of the paired comparators exhibits hysteresis, its paired comparator does not.

In FIG. 11, resistance bridge 1101 divides the input signal $I_a$ into currents $I_k = I_a/2^{k+1}$ that are provided to comparators 1121–1124 and 1131–1133 of the type presented in FIG. 7. The output signals of comparators 112k are designated by $S_k$ and the output signals of the comparators 113k are designated by $C_k$. Because of the above discussed choice of offset signals $I_k^{offset}$ and $I'_k^{offset}$, $S_k$ and $C_k$ are complementary binary signals outside of those regions in which one of them is hysteretic. The offset currents $I_k^{offset}$ and $I'_k^{offset}$ establish the phase relationships of the junction current signals displayed in FIG. 10. Exclusive OR gates 1141–1143, AND gates 1151–1153 and 1161–1163, and OR gates 1171–1173 establish the relationship that the binary output signal $B_k$ is equal to $S_k$ if and only if $B_{n+1} B_n \ldots B_{n-k} B_{n-k+1}$ is zero, where $B_{n+1} \equiv 0$.

I claim:

1. An analog to digital converter comprising:
   a SQUID having: a first Josephson junction, a second Josephson junction, a clocked bias input, an input for input of an analog signal $I_a$ under test, and a current return path; and
   state sensing means for producing a binary output signal B indicative of whether said second junction is in a resistive state or a superconducting state;
   said SQUID having in series, in the following order, said input, said first Josephson junction (62), said clocked bias input, said second Josephson junction and then said current return path;
   said first and second Josephson junctions characterized, respectively, by critical currents $I_o$ and $I_s$ selected such that a junction current $I_J$ passing in series through said Josephson junctions exhibits no hysteresis for an analog signal having a frequency of substantially zero.

2. An analog to digital converter as in claim 1 wherein $I_s$ is much larger than $I_o$.

3. An analog to digital converter as in claim 1 wherein $I_s/I_o$ is at least 3.

4. An analog to digital converter as in claim 1 wherein said state sensing means comprises:
   a source of a clocked bias signal, said source being coupled to said clocked bias input; and
   an impedance coupled to said clocked bias input (66), this impedance having a first voltage drop across it when said Josephson junctions are each in a resistive state and having no voltage drop across it when said Josephson junctions are each in a superconductive state.

5. An analog to digital converter as in claim 4 further comprising a pulse generator for applying a pulse to said clocked bias input.

6. An analog to digital converter as in claim 5 wherein said clocked bias signal has an amplitude $I_r$, wherein said pulse has an amplitude $I_p$ and wherein said pulse is applied to the clocked bias input at a time such that a total signal $I_r+I_p$ is applied to the clocked bias input.

7. An analog to digital converter as in claim 6 wherein $I_r+I_p$ is selected to bias the clocked bias input such that, if $I_a$ is equal to a preselected threshold value, then there will be a 50% noise induced probability that said Josephson junctions will make a transition from a superconducting state to a resistive.

8. An analog to digital converter as in claim 7 wherein said SQUID has a first inductance L, between the first Josephson junction and the second Josephson junction along a conductive path that does not pass through the clocked bias input, wherein said SQUID has a second inductance $L_2$ between the first Josephson junction and the second Josephson junction along a conductive path that does not pass through the clocked bias input (66), and wherein $L_2$ is less than or equal to 1 picoHenry.

9. An n-bit analog to digital converter comprising n converters as in claim 1.

10. An n-bit analog to digital converter as in claim 9 and further comprising a current dividing circuit that applies a current to each of the n converters, the current $I_k$ which is applied to the kth converter being given by $I_k=I_a*M/2^k$ where M is a constant, the kth converter being operative to give an output according to the magnitude of the current $I_k$ received by that converter, the outputs of the n converters collectively representing an n-bit binary value for the magnitude of the signal $I_a$.

11. An n-bit analog to digital converter as in claim 10 further comprising means for applying to the clocked bias input of each of these n converters an associated offset signal $I_k^{offset}$.

12. An n-bit analog to digital converter as in claim 11 wherein these offsets are selected to produce a Grey code digital representation of the signal $I_a$.

13. An n-bit analog to digital converter as in claim 12 further comprising n−1 additional converters as in claim 1, one of these 2n+1 converters receiving the current $I_1$ and, for k=2, ..., n, a pair of these converters each receiving the current $I_k$, said two converters in a pair being referred to herein as the S converter and the C converter;

said n−1 S converters plus the converter receiving the current $I_1$, in combination, producing binary signals $S_k$ (k=1, ..., n) that provide a Grey code representation of $I_a$ and said C converters each producing a binary signal that is complementary to the binary signal produced by the other converter in that pair;

these n−1 additional converters each receiving at its clocked bias input an offset signal $I'_k{}^{offset}$ such that for each of these n−1 pairs of comparators, these two comparators exhibit a junction current $I_J$ that, as a function of $I_a$, is a half-period out of phase with the other of these two comparators in this pair; and logic means for utilizing the complementary binary signals in a pair such that no binary signal is utilized during a dynamic hysteretic period of that signal.

14. An analog to digital converter comprising:

a first comparator and a second comparator, each comprising:

means responsive to an input signal for producing a signal that is a periodic function of the input signal and that, in each period, crosses a threshold value at a first threshold crossing and at a second threshold crossing;

means for generating a binary output signal indicative of whether said periodic signal is above said threshold;

said periodic signal having in each period a smaller deviation from an ideal response in a first neighborhood of the first threshold crossing than in a second neighborhood of the second threshold crossing in that period;

means for offsetting these periodic signals by an amount such that, in each period of said periodic signal, the first threshold crossing of the periodic signal for the first comparator is aligned with an ideal value of the input signal at which said second threshold crossing should occur; and means for producing a binary signal that is determined by the binary output signal from the first comparator over a plurality of ranges that include the first threshold crossing in each period of the first comparator, and that is determined by the binary output signal in ranges that include the second threshold crossing in each period of the first comparator.

15. An analog to digital converter as in claim 14 wherein the means responsive to an input signal is operative to space the first and second threshold crossings one-half period apart such that the output signal of the second comparator is substantially equal to the complement of the output signal of the first comparator.

* * * * *